United States Patent [19]

Dummermuth et al.

[11] 3,754,235

[45] Aug. 21, 1973

[54] DIGITAL TO ANALOG CONVERTER

[75] Inventors: Ernst Dummermuth, East Cleveland; Ronnie G. Walters, Highland Heights, both of Ohio

[73] Assignee: Allen-Bradley Company, Milwaukee, Wis.

[22] Filed: Mar. 1, 1971

[21] Appl. No.: 119,586

[52] U.S. Cl. ..... 340/347 DA, 235/150.53, 235/197, 318/604

[51] Int. Cl. ........................ G05b 19/30, H03k 13/02

[58] Field of Search ............................ 340/347 DA; 235/150.52, 150.53, 197; 318/603, 604, 571, 599; 328/107, 180

[56] References Cited

UNITED STATES PATENTS

| | | | |
|---|---|---|---|
| 3,646,545 | 2/1972 | Naydan et al. | 340/347 DA |
| 3,617,885 | 11/1971 | Wheable | 340/347 AD |
| 3,662,163 | 5/1972 | Miller et al. | 340/347 AD |
| 3,435,196 | 3/1969 | Schmid | 340/347 DA |
| 3,447,149 | 5/1969 | Groth | 340/347 DA |
| 3,573,803 | 4/1971 | Chatelon et al. | 340/347 DA |
| 3,576,575 | 4/1971 | Hellworth et al. | 340/347 DA |

*Primary Examiner*—Maynard R. Wilbur
*Assistant Examiner*—Thomas J. Sloyan
*Attorney*—Lindenberg, Freilich & Wasserman

[57] ABSTRACT

There is provided a digital to analog converter whose transfer function can be made either linear or non-linear depending upon whether or not the clock pulses provided therefore have a constant or a variable frequency. This provides a means for implementing a quadratic gain characteristic so that when used with a positioning servo the performance thereof is greatly enhanced.

9 Claims, 3 Drawing Figures

INVENTORS
ERNST DUMMERMUTH
RONNIE G. WALTER
BY Lindenberg, Freilich & Wasserman
ATTORNEYS

INVENTORS
ERNST DUMMERMUTH
RONNIE G. WALTER
BY

ATTORNEYS

INVENTORS
ERNST DUMMERMUTH
RONNIE G. WALTER
BY

ATTORNEYS

DIGITAL TO ANALOG CONVERTER

BACKGROUND OF THE INVENTION

This invention relates to digital to analog converter circuits and more particularly to improvements therein.

There are a large number of digital to analog converter techniques employed for converting digital data into analog form. These techniques may include either a serial conversion or a parallel conversion. Parallel converters generally include a weighted resistor network. The digits of the digital number are applied to the weighted resistor networks in a manner so that, across an output resistor, a voltage is established representative of the digital number. For serial "D/A" conversion there is a requirement that the analog voltage obtained from the lower bits of the binary number must decay to one-half of its value before the next higher bit is converted. Converters of this type suffer from the requirement that the elements used for their construction (resistors, capacitors, electronic switches, etc.), must be carefully selected and these components must have extremely low temperature coefficients in order to guarantee linearity and monotonicity.

Monotonicity occurs when two digital numbers A and B are converted to analog form, where A is larger than B, the analog voltage representing A must be larger than the one representing B. Lack of monotonicity generally occurs at 0 or when high bits are introduced.

There are many instances such as in the use of a digital to analog converter in a numerical machine tool control system where a predetermined transfer function is desired for the converter. To do this has heretofore been difficult and has involved many circuits.

OBJECTS AND SUMMARY OF THE INVENTION

An object of this invention is to provide a digital to analog converter circuit whose transfer function has a high degree of linearity when it is desired.

Another object of the present invention is the provision of a digital to analog converter which is monotonic regardless of the word length of the binary number being converted.

Still another object of this invention is the provision of a digital to analog converter whose transfer function can be readily altered to provide any desired non-linear characteristic while maintaining monotonicity.

Yet a further object of the present invention is the provision of an arrangement for a digital to analog converter which generates a special non-linear transfer function such as a quadratic function which is particularly suitable for application to motor drives.

These and other objects of the invention are achieved in an arrangement wherein the digital number to be converted is entered into a counter. In a preferred mode of operation, if the number is positive the counter will count down to zero and if the number is negative the counter will count up to zero. In another mode of operation, the magnitude of the digital number is entered into the counter, the counter only counts down to zero, however, if the original digital number was negative the output analog voltage will be negative, too.

When the counter commences to count, a flip-flop is set. When the counter reaches its zero count or a predetermined count interval has elapsed, the flip-flop is reset. Thus the flip-flop output is a pulse whose width is proportional to the number that was inserted into the counter.

When the predetermined interval has elapsed the counter is loaded anew with the digital number and the counter commences to count again. Thus the output of the flip-flop is repeated at fixed time intervals (sampled) and the resulting pulse width modulated pulse train is applied to a low pass filter to obtain the actual analog voltage.

If the clock used for the counter is taken from a constant frequency source, a linear transfer characteristic is obtained. However, if the frequency of the count clock is modified during the conversion, a non-linear, but still monotonic transfer function is obtained.

In the special application for motor drives, for each sample of the digital number, the count frequency is started at a low value (e.g. 250 KHz) and is increased during the conversion to a high value (e.g. 2 MHz). Assuming that the digital number is representative of a "following error" of a closed loop drive system, then the gain of the "position loop" decreases whenever the following error increases.

The novel features of the invention are set forth with particularity in the appended claims. The invention will best be understood from the following description when read in conjunction with the accompanying drawings.

DESCRIPTION OF THE PREFERRED EMBODIMENT

It is believed that the digital to analog converter, in accordance with this invention, has widespread use. However, since its development occurred in connection with a need for a digital to analog conversion circuit for providing a non-linear transfer function particularly suitable for application to the motor drive used in a numerical control machine tool, the description which follows will show its application to such use, by way of exemplification of its utility. This, however, should not be construed as a limitation upon the invention.

In a numerical control machine tool, the difference between the commanded position and its actual position is called a following error. The following error may be expressed as a digital number which is converted to analog form and then used to drive the machine tool table to the commanded position at which point the following error should be zero.

In U.S. Pat. application Ser. No. 841,846, filed on July 15, 1969, by the inventor Dummermuth herein and assigned to this assignee (now U.S. Pat. No. 3,617,718, entitled "Numerical Control Contouring System Wherein Desired Velocity Information Is Entered Into This System Instead of Feedrate Number"), there is described a numerical control machine tool system in which the digital following error for each axis is converted to an analog value which is applied to the motor driving the machine tool table along that axis. In order to improve the performance of the system the error signal applied to the digital to analog converter which is employed is altered in order that the converter provide a desired and most advantageous transfer characteristic. As will be seen from the description that follows, a desired transfer characteristic is obtained from the digital to analog converter used herein by varying the frequency of the clock signals that drive the converter.

Figure 1:
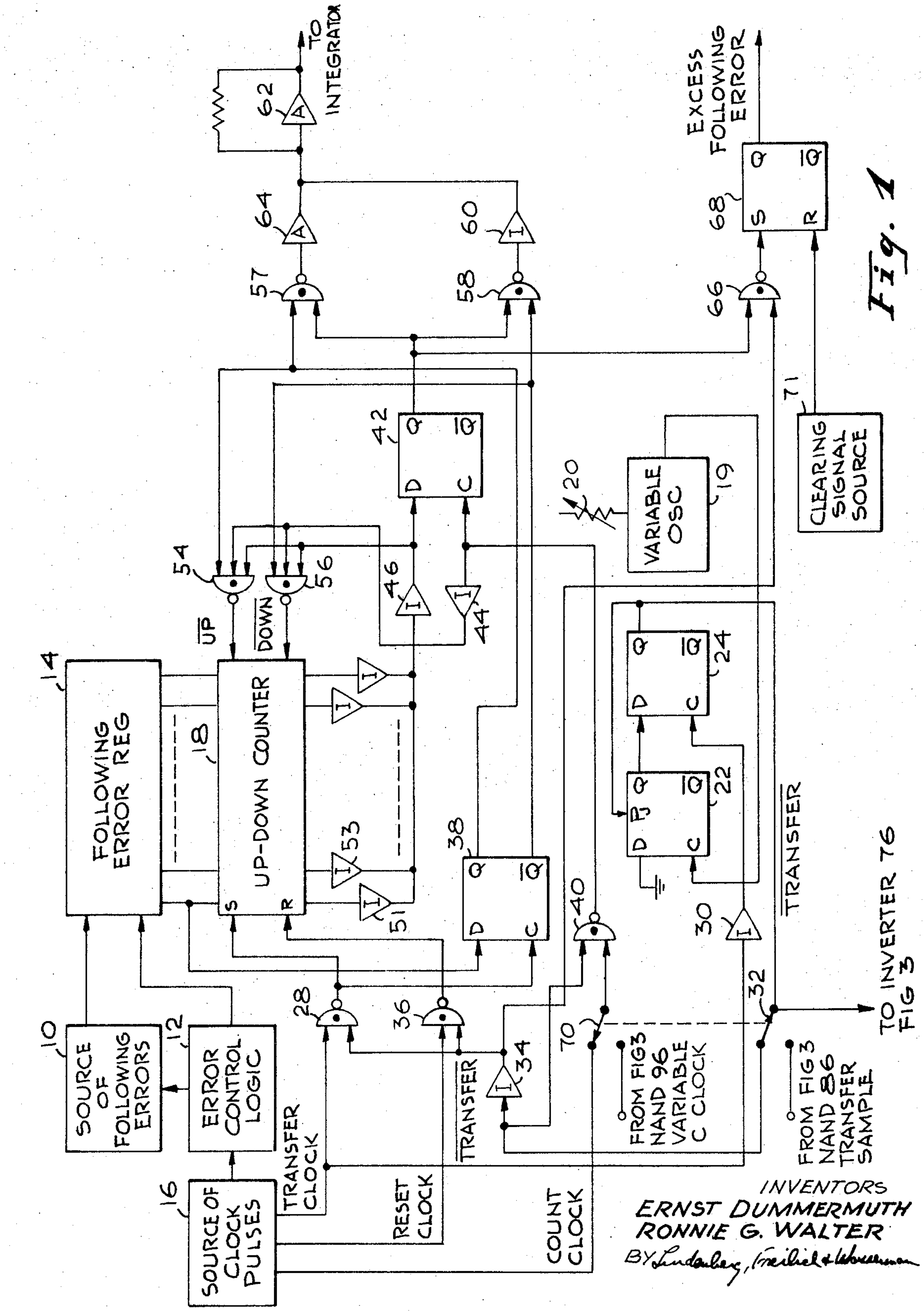
FIG. 1 is a block schematic diagram of a digital to analog converter in accordance with this invention.

Referring now to FIG. 1, which is a block schematic diagram of the invention, a "source of following errors," 10, which are digital numbers, under the control of "error control logic," 12, enters a following error digital number into a following error register 14. The source of following errors 10 may be a numerical control system such as briefly described above, wherein the difference between the commanded position and the actual position along an axis, of a machine tool table is expressed as a digital number and is continuously being generated as the machine tool table moves in the direction commanded. The error control logic 12 may be any suitable logic arrangement under control of timing pulses from a source of clock pulses 16, which enables the source of following errors 10 to transfer successively updated following error numbers into the following error register and which enables the following error registers to receive these numbers. These are well known circuits and thus it is not believed that details need be described. An arrangement for accomplishing these functions is shown for example in the application previously referred to.

The digital to analog conversions are initiated from the transitions of a free running oscillator 19 (sample rate) whose frequency of oscillation occur on the order of milliseconds and may be adjusted by any suitable means, which is here represented by a potentiometer 20.

The output of the oscillator 19 is connected to the C input of a flip-flop 22. Upon the occurrence of a positive transition in the output of the oscillator 19, flip-flop 22 gets reset and its Q output provides a low signal to the D input of flip-flop 24. The low signal at the D input of flip-flop 24 is transferred to its Q output upon the occurrence of a synchronizing pulse applied to its C input. This synchronizing pulse is originated by the source of clock pulses 16 and is designated as a Transfer Clock Signal. Transfer Clock signals are a pulse train emitted from source 16 wherein pulses occur on the order of microseconds. The Transfer Clock is applied through an inverter 30 to the C input of flip-flop 24. In response to this synchronizing pulse the Q output of flip-flop 24 goes low. This is a $\overline{\text{transfer}}$ signal. The Q output of flip-flop 24 is connected to the $P_j$ input of flip-flop 22 immediately setting flip-flop 22 with its Q output high. The "low" Q output of flip-flop 24 via a switch 32 is applied through an inverter 34 to one input of a NAND gate 28 and to one input of a NAND gate 36. Immediately preceding the Transfer Clock from source 16 is a signal called Reset Clock, also originated in source 16. Since both gates 28 and 36 are qualified by the output of flip-flop 24, the Reset Clock signal passes through gate 36, resetting the up-down counter 18. Thereafter the Transfer Clock Signal passes through gate 28, transferring new data from the following error register 14 to the up-down counter 18.

It should be noted that the digit in the most significant bit position of the digital number in the following error register is assigned the function of representing the polarity of that number. For example, if a 1 is found in that most significant bit position it represents that the number is negative and if a 0 is found in that most significant bit position it represents that the number is positive. The most significant bit position of the following error register is connected to the D input of a sign flip-flop 38. The transfer clock output of the NAND gate 28 is applied to the C input of the flip-flop 38. Therefore, if there is a 1 in the most significant bit position of the number in the following error register, the sign flip-flop is set with its Q output high. If there is a 0 in the most significant bit position then the sign flip-flop is set with its $\overline{Q}$ output high.

It must be recognized that only one Reset Clock pulse (from source 16) can pass through gate 36 and only one Transfer Clock pulse (from source 16) can pass through gate 28, since flip-flop 24 gets set by the trailing edge of the Transfer Clock pulse applied via inverter 30 to its C input thus terminating the $\overline{\text{transfer}}$ signal. The D input of flip-flop 24 was made high via the feedback path from the Q output of flip-flop 24 to $P_j$ of flip-flop 22 as previously described.

The $\overline{\text{transfer}}$ signal from the Q output of flip-flop 24 is also applied to a NAND gate 40 disabling it so it cannot pass count clock pulses from source 16 to the C input of a flip-flop 42 and to an inverter 44 during the transfer of a number from the following error register 14 to the updown counter. The output of NAND gate 40 is also applied to an inverter 44.

The input of an inverter 46 is connected to a zero detecting circuit, which is connected to the up-down counter. This zero detecting circuit constitutes inverters such as 51 or 53, which are connected to each stage of the up-down counter and which will produce a 0 output when there is a 1 in that stage and a 1 output when there is a 0 in that stage. The outputs of all of these inverters are connected together and are applied to the inverter 46. Therefore, when the contents of the up-down counter is not equal to zero, i.e., when there is a 1 in any stage of the up-down counter there will be a zero output applied to the input of inverter 46 and its output will be a 1 or a high signal.

A second input to NAND gate 54 is the Q output of flip-flop 38. A second input to NAND gate 56 is the $\overline{Q}$ output of flip-flop 38. A third input to these NAND gates is the output of inverter 44. The output of inverter 46 renders the D input of flip-flop 42 high and also is applied to NAND gates 54 and 56. Either NAND gate 54 or NAND gate 56 is enabled, depending upon the state of the sign flip-flop 28.

When the transfer period is completed (i.e., transfer of a number into the counter), indicated by the Q output of flip-flop 24 going high NAND gate 40 is released and count clock pulses from clock source 16 are applied to the C input of flip-flop 42 and to inverter 44. If the contents of the up-down conunter is not equal to zero the first count pulse, sent from gate 40 sets flip-flop 42 with its Q output high and it is also routed via inverter 44, and gate 54 or 56 to the count input of the up-down counter to cause it to count up or down. More count pulses follow from gate 40 stepping the counter towards zero. When all stages of the up-down counter are zero, then the input to inverter 46 becomes a 1, its output a 0 and thus neither of the NAND gates 54 or 56 can pass clock pulses to the counter. Since the output of inverter 46 is connected to the D input of flip-flop 42 the next count pulse from gate 40 causes the Q output of flip-flop 42 to go low. As a result the width of the pulse appearing at the Q output of flip-flop 42 is determined by the interval required to cause the up-down counter to count from whatever digital number is introduced thereinto until zero.

The Q output of flip-flop 42 is applied to two NAND gates respectively 57 and 58. The other inputs to the respective NAND gates 57 and 58 are the respective Q and Q outputs of flip-flop 38. Accordingly, one or the other of the two NAND gates is enabled, as determined by the polarity of the number which has just been counted through in the counter 18. If the number was positive then NAND gate 58 is enabled. This inverts the pulse received from flip-flop 42. An inverter amplifier 60 follows NAND gate 58 and restores the polarity of the pulse and then applies it to an operational amplifier 62. The operational amplifier is a low band pass amplifier. Its output is applied to either an integrator or to the servo motor for the numerical machine tool control system, if the system is being so used, which serves the function of integrating the width modulated input.

If the number is negative, then NAND gate 57 is enabled. Its output is applied to an amplifier 64, which does not invert it and thus the negative going signal is applied to operational amplifier 62.

The operation of the digital to analog converter which just has been described repeats each time a transition is obtained from the free running oscillator 19. As a result, the pulse train which appears at the Q output of flip-flop 42 has a frequency equal to the frequency of the oscillator 19 whereas the duty cycle or pulse width is determined by the magnitude of the digital number and the count frequency applied to the up-down counter.

If it is desired to know whether or not there is an excess following error, that is, the counter did not completely count through the entire number when the transfer signal comes on then an indication of excess following error may be provided. This is done by applying the Q output of flip-flop 42 to a NAND gate 66. The other required input to the NAND gate is a transfer pulse which is derived from the Q output of flip-flop 24 and inverted in inverter 34. The operation is quite simple: If a new sample occurs, i.e., Q of flip-flop 24 goes low and the up-down counter has not finished counting, i.e., Q of flip-flop 42 is still high, a signal appears at the output of NAND gate 66 setting a flip-flop 68 with its Q output high, indicating an excess following error, or generally speaking indicating that the D/A left the active region and saturated, i.e., the Q output of flip-flop 42 remains high. Flip-flop 66 is reset by receiving a signal from a "clear signal source" 71.

As a brief review of the operation described what might be called a sampling period is initiated from a transition of the free running oscillator. After synchronizing this oscillator pulse with the Transfer Clock a signal transfer is generated at the Q output of flip-flop 24 which inhibits count clock signals to the up-down counter and enables a Reset Clock signal to clear the up-down counter, and thereafter enables the transfer of digital data from the following error register to the up-down counter. When the transfer signal returns back high, the counter commences counting up or down depending upon the algebraic sign of the number in the up-down counter. With the first count pulse flip-flop 42 is set and when the up-down counter reaches zero this flip-flop is reset. Therefore the output of flip-flop 42 is a pulse whose width is determined by the time required for the counter to count from the number entered thereinto until it has reached zero.

The conversion of a digital number into a pulse width is then repeated at the rate established by the frequency of the oscillator 19, which is very much less than the frequency of the transfer clock pulse train and therefore its frequency is determinative.

If operation in a single counting mode is desired, where negative numbers exist in sign magnitude form, then the up-down counter may be replaced by a down counter. In this event NAND gate 54 may be eliminated, the input from flip-flop 38 to NAND gate 56 may also be eliminated and the most significant bit of the following error register 14 is only connected to the D input of the sign flip-flop 38 eliminating the connection to the downcounter. The counter will then count down to zero from whatever value is entered into it.

Figure 2:
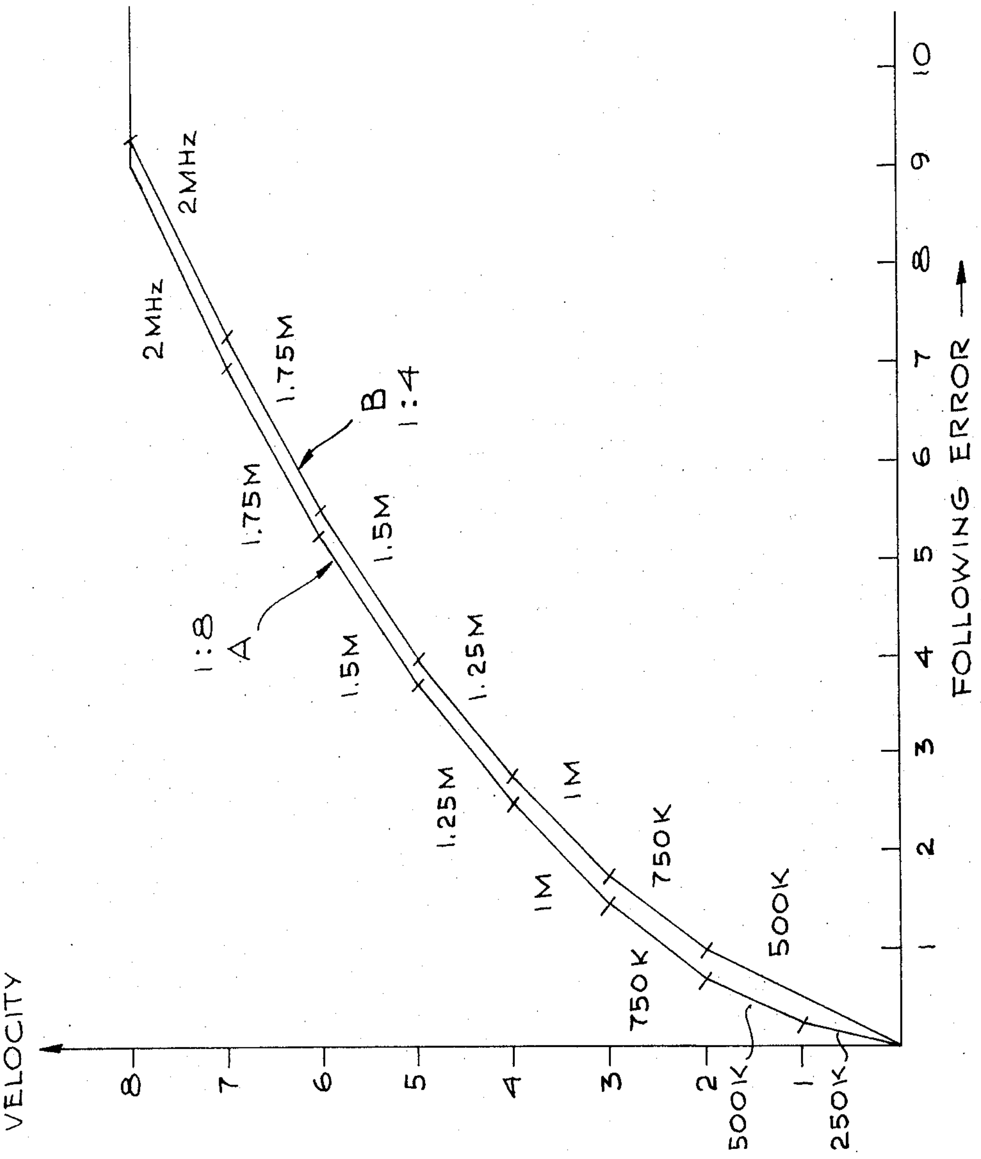
FIG. 2 shows two curves each illustrating an analog voltage versus following error, which is desired for operating a motor in a numerical control machine tool system.

If the count clock is taken from a constant frequency source, a linear transfer characteristic is obtained from the digital to analog converter which is described. However, if the frequency of the count clock is modified during the conversion, a non-linear, but nonetheless still monotonic, transfer function is obtained. FIG. 2 is a graph illustrative of two of many different transfer functions which may be obtained by varying the count frequency during conversion. The abscissa shows the value of the digital number to be converted whereas the ordinate indicates the analog voltage. It should be noted that the break points of the transfer function of curves A and B shown in FIG. 2 essentially coincide with discrete points of a parabola. The transfer functions of the digital to analog converter are desired to improve both the positioning capability and torque performance of the servo motor driving the machine tool table. However, it should be borne in mind that these transfer functions are exemplary only and are not to be construed as a limitation upon the invention.

Adjacent each curve are numbers representative of clock frequencies. These clock frequencies are applied to the counter resulting in the transfer characteristic shown. This will become more clear from the explanation which follows. Curve A has a higher zero gain than curve B and may be desirable for a more accurate positioning system.

In FIG. 1, in the count clock line connecting from the source of clock pulses 16 to the NAND gate 40 there may be seen a single pole double throw switch, 70. There is another single pole double throw switch 32, in the transfer line. These switches are ganged together, and when it is desired to provide a non-linear operation of the digital to analog converter, the switches are thrown to the position where they will engage the terminals. Switch 70 will apply a variable frequency count clock from the circuit of FIG. 3 to the counter. Switch 32 will provide a transfer sample signal from inverter 86 (FIG. 3) to NAND gate 40, whereas Q from flip-flop 24 provides a transfer signal from FIG. 1 to a counter in FIG. 3.

Figure 3:
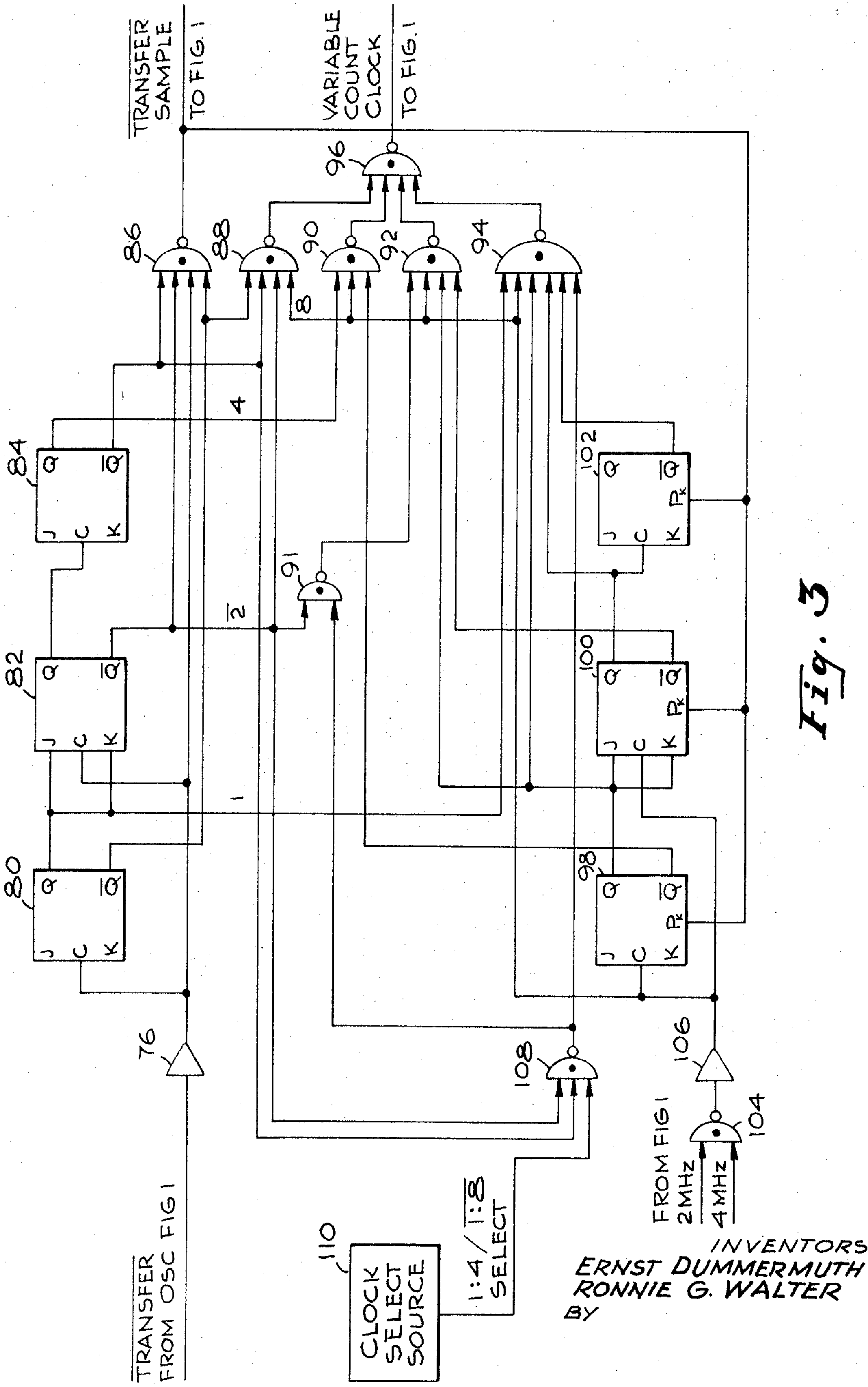
FIG. 3 is a block schematic diagram of the additional circuitry required for FIG. 1 in order that it operate non-linearly and provide the transfer functions represented by the curves of FIG. 2.

The transfer signal from FIG. 1 in FIG. 3, is applied to an inverter 76, the output of which is used to drive a counter made up of three flip-flops respectively 80,

82 and 84. This constitutes an eight state counter. All the $\bar{Q}$ outputs of the flip-flops of this counter are applied to a NAND gate 86. The output of this NAND gate is designated as a $\overline{\text{transfer}}$ sample. Effectively NAND gate 86 detects the eighth (zero) count of the counter. A second NAND gate 88 is also connected to receive the eighth (zero) count of the counter. The fourth count of the counter is connected to a NAND gate 90. This fourth count is the Q output of flip-flop 84. The second count of the counter, or $\bar{Q}$ output of flip-flop 82, is connected to a NAND gate 91 whose output is connected to a NAND gate 92. The Q output of flip-flop 80, which is the first count of the counter is applied to a NAND gate 94. The outputs of NAND gates 88, 90, 92 and 94 are applied to another NAND gate 96.

The NAND gates 88 through 96, constitute the rate multiplier gates for a rate multiplier counter. The rate multiplier counter is made of three flip-flops respectively 98, 100, 102. By way of illustration, to exemplify the operation of the system, a 2 MHz and a 4 MHz signal are applied to a NAND gate 104. The output of the NAND gate 104 is applied to an inverter 106. The output of inverter 106 drives the rate multiplier counter, and constitutes one input to NAND gates 88, 90, 92, and 94. The Q output of flip-flop 98 is applied to NAND gate 94 and NAND gate 92. The $\bar{Q}$ output of flip-flop 98 is applied to NAND gate 90. The Q output of flip-flop 100 is applied to NAND gate 94. The $\bar{Q}$ output of flip-flop 100 is applied to NAND gate 92. Over the eight intervals into which the counter comprising flip-flops 80, 82 and 84 divide the $\overline{\text{transfer}}$ interval, there will be emitted from NAND gate 96 the following frequencies 250 KHz, 500 KHz, 750 KHz, 1 MHz, 1.25 MHz, 1.5 MHz, 1.75 MHz and 2 MHz.

Since it will take eight $\overline{\text{transfer}}$ signals to cause the counter made of flip-flops 80, 82, 84 to count to 8, in order to obtain $\overline{\text{transfer}}$ pulses at the same rate as is obtained for linear operation it is necessary to speed up the operation of the oscillator 19 by 8 times in order to get the same $\overline{\text{transfer}}$ rate or sampling rate for the digital to analog converter. This is easily done by adjusting the variable oscillator by a means such as the variable potentiometer 20.

As thus far described, the FIG. 3 circuit will enable a transfer characteristic as represented by curve A in FIG. 2. In order to enable the sequence of clock count frequencies which produces the transfer characteristic represented by curve B, then a NAND gate 108 is added. Its output is connected to NAND gate 91 and to NAND gate 94. The $\bar{Q}$ outputs of flip-flops 82 and 84 constitute the other two inputs of NAND gate 108. When a select signal source 110 applies an input to NAND gate 108 then the sequence of frequencies shown adjacent curve B is achieved. In the absence of the select signal input then the sequence of frequencies shown adjacent curve A is achieved. A consideration now of the operation of the system used for example with a numerical machine tool control system, reveals the following. When the numerical control system first starts to operate, there is a small following error signal. This will produce a relatively wide pulse since the rate multiplier first produces the lowest clock frequency (250 KHz) causing the counter to count slowly. As the error signal builds up, the pulse width of the output of the digital to analog converter increases, but the pulse width increases less rapidly than does the feedback error number since the variable count clock frequency begins to increase with an increasingly larger number in the counter thus speeding up the count down of the counter. The pulse width will increase until it reaches its optimum value, or saturation value, which is predetermined, and usually is set in accordance with the motor which is being driven.

The operation which occurs as the feedback error signal begins to decrease, is opposite to the situation described above when the machine tool is coming toward the end of a commanded path, or is approaching the position to which it was commanded to move. With the decreasing feedback number the width of the pulse provided by the counter output decreases at a slower rate, thus slowing down the motor less rapidly than would be achieved if the system operated linearly. Therefore a lower peak torque is required.

The theoretical considerations which were noted in selecting the curves shown in FIG. 2 were as follows. It is desirable to reduce the torque requirements which are made on the servo drive when decelerating to null. That is when a conventional drive servo is designed, the position gain is essentially dictated by the accuracy requirements. Having selected a position gain indicates some given torque requirement for each velocity from which a deceleration might occur. This torque requirement is a function of the dynamics of the servo loop and as such must be met by the drive or overshoot will result. It can be deduced from the foregoing description that the build-up in torque which is required for acceleration to a predetermined maximum velocity, and the reduction in torque, which is required when approaching the stopping point, is more effectively carried out by the non-linear operation of the digital to analog converter during the starting up interval and during the slowing down interval as described above.

The foregoing material has described a means by which a non-linear digital to analog conversion may be made, of which a quadratic characteristic is a particular embodiment of a means for achieving a quadratic gain characteristic, which is shown to greatly enhance the performance of a positioning system. The described digital to analog converter is not meant to be limiting as to means for implementing a quadratic gain characteristic. The intent of the quadratic characteristic is to increase the attainable velocity of a positioning system without sacrificing gain at small position errors, and without the requirement for greater torque capability.

The non-linear gain which achieves these desirable characteristics is described by a family of parabolas of which (A) and (B) of FIG. 2 are examples. This gain characteristic in a normalized form is described by the following equations.

$$Y = G_o X \text{ for } o \leq X < X_o$$

$$Y = \sqrt{2A_o(X - A_o/2G_o^2)} \text{ for } X_o \leq X$$

where $$Y_o = A_o/G_o$$

$$X_o = A_o/G_o^2$$

and

Y = Velocity Command
X = Following Error
$A_o$ = Acceleration Capability Of Velocity Servo
$G_o$ = Required Gain For Small Following Error It can be shown that ($Y_o$) represents the maximum attainable velocity for a specified ($A_o$) and ($G_o$), which would not result in overshoot. Therefore ($Y_o$) is the velocity limitation on a linear servo characteristic. This is because at any greater velocity deceleration into null would require a greater acceleration than ($A_o$), However, with the parabolic gain characteristic described above, deceleration from any velocity greater than ($Y_o$) only requires a constant amount of acceleration equal to ($A_o$).

Thus, the parabolic characteristic removes the acceleration capability of the velocity servo as a limitation on attainable velocity.

There has accordingly been described and shown a novel, useful and accurate digital to analog converter which can be operated in either a linear or non-linear mode and which retains its monotonicity independent of the word length of the binary number being converted into an analog value. Further, the transfer function of the digital to analog converter may be made to conform to a predetermined curve by varying the values of the frequencies of the clock signals used to drive the converter.

What is claimed is:

1. A system for converting a digital number into an analog value comprising:

means for establishing a transfer signal followed by a sampling signal having a duration representative of a desired sampling interval, counter means, means responsive to said transfer signal for forcing said counter means to assume a count state representative of said digital number, a source of clock signals, means responsive to said sampling signal to enable said clock signals to be applied to said counter means to cause it to count from the assumed count state to a predetermined count state, means for detecting when said counter means has reached said predetermined count state and producing an end of count signal representative thereof, flip-flop means responsive to said clock signals being applied to said counter to initiate a pulse and responsive to said end of count signal or to the end of said sampling signal to terminate said pulse whereby the width of the pulse output of said flip-flop means is an analog representation of said digital number when said pulse is terminated by said end of count signal, and whereby the width of said pulse output represents the width of said sampling signal when said pulse is terminated responsive to the end of said sampling signal indicative that said digital number exceeds the active range of said system.

2. A system as recited in claim 1 wherein said source of clock signals includes means for changing the frequency of said clock signals in a predetermined pattern over the duration of said sampling interval.

3. A system as recited in claim 2 wherein said predetermined frequency pattern of clock signals provides a quadratic gain characteristic for said digital to analog converter.

4. A system as recited in claim 1 wherein said digital number has a digit position thereof assigned to represent whether said digital number is positive or negative, means responsive to a digital number being positive for providing a first output signal and to a digital number being negative for providing a second output signal, gate means responsive to said first output signal for causing said counter to count in a descending count mode and responsive to said second output signal for causing said counter to count in an ascending count mode.

5. A system as recited in claim 2 wherein said means for changing the frequency of said clock signals over the duration of said sampling interval incudes means responsive to said sample signal for dividing each sampling interval into a plurality of successive intervals and providing an interval count signal over each interval, means to which said clock signals are applied for generating a plurality of different frequency clock signals, and gate means to which said interval count signals and plurality of different frequency clock signals are applied for selecting in succession different ones of said plurality of different frequency clock signals.

6. A system for determining the transfer characteristic of a digital to analog converter which converts digital numbers to analog values comprising:

means for establishing a transfer signal followed by a sampling signal having a duration representative of a desired sampling interval, counter means, a source of digital numbers, means responsive to said transfer signal for forcing said counter means to assume a count state representative of a digital number from said source, means responsive to said sampling signal for establishing successive intervals over the duration of said sampling interval and providing an interval count signal over each interval, means for generating a plurality of different predetermined frequency clock signals, gate means to which said interval count signals and said plurality of different predetermined frequency clock signals are applied for successively selecting and outputting different ones of said plurality of different predetermined frequency clock signals in accordance with the transfer characteristic desired for said digital to analog converter, means responsive to said transfer signal for applying the output of said gate means to said counter means to cause it to count from its assumed count state to a predetermind count state, means for detecting when said counter means has reached said predetermined count state and producing an end of count signal at that time, flip-flop means responsive to said clock signals being applied to said counter to initiate a pulse and responsive to the said sampling signal being terminated or to said end of count signal to terminate said pulse whereby the width of the pulse output of the flip-flop means is an analog representation of said digital number when said flip-flop means terminates said pulse responsive to said end of count signal and in either case is not linearly related to the size of said digital number.

7. A system as recited in claim 6 wherein said predetermined frequency pattern of clock signals provides a quadratic gain characteristic for said digital to analog converter.

8. A system as recited in claim 6 wherein said digital number has a digit position thereof assigned to represent whether said digital number is positive or negative, means responsive to a digital number being positive for providing a first output signal and to a digital number being negative for providing a second output signal, gate means responsive to said first output signal for causing said counter to count in a descending count mode and responsive to said second output signal for causing said counter to count in an ascending count mode.

9. A system as recited in claim 6 including means for determining whether said digital number is positive and producing a first signal representative thereof, or negative and producing a second signal representative thereof, and means to which the pulse output of said flip-flop means is applied for inverting the polarity of said pulse output responsive to said second signal and leaving the polarity uninverted responsive to said first signal.

* * * * *